United States Patent
Tanigawa et al.

(10) Patent No.: US 10,481,217 B2
(45) Date of Patent: Nov. 19, 2019

(54) MAGNETIC FIELD SENSOR

(71) Applicant: YAZAKI CORPORATION, Tokyo (JP)

(72) Inventors: Junya Tanigawa, Shizuoka (JP); Hiroki Sugiyama, Shizuoka (JP); Makoto Ishii, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 119 days.

(21) Appl. No.: 15/815,619

(22) Filed: Nov. 16, 2017

(65) Prior Publication Data

US 2018/0143266 A1    May 24, 2018

(30) Foreign Application Priority Data

Nov. 18, 2016 (JP) ................. 2016-225327

(51) Int. Cl.
*G01R 33/06* (2006.01)
*G01R 33/00* (2006.01)

(52) U.S. Cl.
CPC ....... *G01R 33/063* (2013.01); *G01R 33/0023* (2013.01); *G01R 33/0088* (2013.01)

(58) Field of Classification Search
CPC .............. G01R 33/063; G01R 33/0023; G01R 33/0088
USPC ...................................................... 324/260
See application file for complete search history.

(56) References Cited

U.S. PATENT DOCUMENTS

| | | | |
|---|---|---|---|
| 5,764,055 A | 6/1998 | Kawase | |
| 6,028,427 A | 2/2000 | Kawase | |
| 6,229,307 B1* | 5/2001 | Umehara | G01R 33/02 324/244 |
| 6,897,649 B2* | 5/2005 | Kawase | G01R 33/028 324/244 |
| 9,739,849 B2* | 8/2017 | Yamamoto | G01R 33/09 |
| 2016/0245879 A1 | 8/2016 | Tanigawa et al. | |

FOREIGN PATENT DOCUMENTS

| | | |
|---|---|---|
| JP | 9-127218 A | 5/1997 |
| JP | 2000-180521 A | 6/2000 |
| JP | 2015-92144 A | 5/2015 |

* cited by examiner

*Primary Examiner* — Reena Aurora
(74) *Attorney, Agent, or Firm* — Kenealy Vaidya LLP

(57) ABSTRACT

A magnetic field sensor includes a magnetic detection element that includes a magnetic material causing a magnetic impedance effect and a bias coil applying a bias magnetic field to the magnetic material, a high-frequency oscillation circuit that supplies a high-frequency current to the magnetic material, an AC bias circuit that supplies an AC bias current to the bias coil, and a detection circuit that sets a reference point corresponding to an extreme impedance position in a characteristic of the magnetic detection element in the state of no application of an external magnetic field and outputs an electric signal changing in response to an impedance change amount from the reference point. The detection circuit includes an amplitude detection circuit which detects an amplitude of the electric signal at a timing of each vertex in which at least a voltage change direction of the electric signal changes.

5 Claims, 8 Drawing Sheets

MAGNETIC FIELD SENSOR

CROSS REFERENCE TO RELATED APPLICATION

This application is based on Japanese Patent Application No. 2016-225327 filed on Nov. 18, 2016, the contents of which are incorporated herein by reference.

BACKGROUND OF THE INVENTION

1. Technical Field

The present invention relates to a magnetic field sensor that uses a magnetic impedance effect.

2. Background Art

For example, JP-A-H09-127218, JP-A-2000-180521, and JP-A-2015-92144 disclose a related art of a magnetic sensor employing a magnetic detection element (MI element) using a magnetic impedance effect. For example, in a high permeability alloy magnetic material such as an amorphous alloy wire, impedance sensitively changes in response to an external magnetic field due to the influence of a skin effect. This is a magnetic impedance effect.

In a configuration disclosed in JP-A-H09-127218, an MI element is incorporated in a Colpitts oscillation circuit. When an AC bias current flows to a coil wound around the MI element, an AC bias magnetic field is applied to the MI element. Then, an amplitude modulated waveform is obtained in the output of the oscillation circuit by a change in impedance of the MI element in response to the external magnetic field and the bias magnetic field. A height difference of the amplitude modulated waveform corresponds to the strength of the external magnetic field. Thus, an output signal having a pulse width modulated digital waveform is obtained in such a manner that the amplitude modulated waveform is detected, a DC element is removed, and a voltage is compared by a comparator. That is, the strength of the external magnetic field is obtained from a change in amplitude of the output of the oscillation circuit.

In a configuration disclosed in JP-A-2000-180521, a high-frequency sine waveform current output from the oscillation circuit is applied to both ends of a magnetic core of a thin film magnetic impedance element via a buffer circuit. A detector circuit detects a magnetic change amount of the external magnetic field from a change amount of the high-frequency current changing in response to the external magnetic field applied to the magnetic impedance element. A hysteresis cancellation circuit that removes the hysteresis of the magnetic impedance element is provided. In order to move the operation point of the magnetic impedance element, a current flows to the bias coil. Furthermore, a current flows to a negative feedback coil in response to the detected magnetic field.

In the magnetic field sensor disclosed in JP-A-2015-92144, a magnetic impedance element having a specific configuration is employed. That is, the magnetic impedance element has magnetic anisotropy in which a longitudinal direction is set as a magnetic field detection direction and an easy magnetization axis of a magnetic film is set as the longitudinal direction. Here, since the magnetic field detection direction is the same as the easy magnetization axis direction of the magnetic film, it is possible to exhibit a magnetic impedance characteristic of a pyramid shape. For that reason, it is not necessary to apply DC and AC biases to a point where an inclination becomes steep like an M-shaped characteristic.

Furthermore, since the hysteresis in the pyramid shape is smaller than that of the M shape, the detection accuracy can be improved. Meanwhile, since the inclination is inclined by a predetermined degree over the entire area, the detection range can be widened. Thus, the consuming current can be suppressed, the detection accuracy can be improved, and the detection range can be widened.

However, the magnetic field sensor of the related art using the magnetic impedance effect disclosed in JP-A-H09-127218 and JP-A-2000-180521 has the following problems. (1) A range of detecting the magnetic field is narrow. (2) Since the magnetic impedance element has the magnetic impedance characteristic of an M shape, it is not possible to perform a highly sensitive measurement if the AC bias is not applied to a position where the inclination is steep in the case of using the AC bias. For that reason, the consuming current increases. (3) In the magnetic impedance element having the magnetic impedance characteristic of an M shape, the hysteresis becomes larger than that of the pyramid shape. For that reason, the detection accuracy is degraded.

Meanwhile, when the magnetic impedance element having the pyramid-shaped magnetic impedance characteristic disclosed in JP-A-2015-92144 is employed, the problems (2) and (3) can be solved. However, when the magnetic field is detected by using a circuit having a configuration illustrated in FIG. 1 of JP-A-2015-92144, the pulse necessary for the output of differentiating circuit illustrated in FIG. 6D of JP-A-2015-92144 does not occur if the external magnetic field increases. For this reason, the phase of the pulse cannot be detected and the magnetic field cannot be detected. Thus, the problem (1) cannot be solved.

The invention has been made in view of such circumstances and an object of the invention is to provide a magnetic field sensor capable of suppressing a current from consuming, improving detection accuracy, and widening a magnetic field detection range.

SUMMARY OF INVENTION

In order to attain the above-described object, the magnetic field sensor according to the invention has the following characteristics (1) to (5).

(1) According to an aspect of the invention, a magnetic field sensor includes:
a magnetic detection element that includes a magnetic material causing a magnetic impedance effect and a bias coil applying a bias magnetic field to the magnetic material;
a high-frequency oscillation circuit that supplies a high-frequency current to the magnetic material;
an AC bias circuit that supplies an AC bias current to the bias coil; and
a detection circuit that sets a reference point corresponding to an extreme impedance position in a characteristic of the magnetic detection element in the state of no application of an external magnetic field and outputs an electric signal changing in response to an impedance change amount from the reference point,
wherein the detection circuit includes an amplitude detection circuit which detects an amplitude of the electric signal at a timing of each vertex in which at least a voltage change direction of the electric signal changes.

(2) In the magnetic field sensor of (1), the detection circuit includes:
a bridge circuit which includes the magnetic material of the magnetic detection element and three resistors and becomes an equilibrium state when the magnetic detection element has an impedance of the reference point; and a voltage detection circuit which detects an output voltage of the bridge circuit.

(3) In the magnetic field sensor of (1) or (2), the detection circuit includes:

a phase difference detection circuit which detects a phase difference at a timing of each vertex in which a voltage change direction of the electric signal changes; and a selection circuit which selects either or both of the phase difference detection circuit and the amplitude detection circuit.

(4) In the magnetic field sensor of (3), the selection circuit automatically selects either or both of the phase difference detection circuit and the amplitude detection circuit in response to a result of identifying a magnitude of a strength of the external magnetic field.

(5) In the magnetic field sensor of (4), the detection circuit acquires a first magnetic field strength calculated on the basis of the phase difference and a second magnetic field strength calculated on the basis of the amplitude by using both outputs of the phase difference detection circuit and the amplitude detection circuit and detects a final magnitude of the external magnetic field on the basis of a result obtained by averaging the first magnetic field strength and the second magnetic field strength.

According to the magnetic field sensor of the configuration (1), the amplitude at the timing of each vertex in which the voltage change direction of the electric signal changes due to the influence of the external magnetic field applied to the magnetic detection element. Thus, when the amplitude is detected by the amplitude detection circuit, the magnitude of the external magnetic field can be detected. Further, since a change in amplitude can be detected even when the external magnetic field increases, the magnetic field detection range can be widened. Since an impedance change amount from the reference point is detected, there is no need to allow the flow of a large bias current for the movement of the operation point and it is possible to suppress an increase in consuming current.

According to the magnetic field sensor of the configuration (2), since the bridge circuit is used, it is hardly affected by a change in voltage of a power supply or a change in temperature. Further, since the bridge becomes an equilibrium state when the magnetic detection element is at the reference point state and the output voltage becomes zero, an impedance change amount with respect to the reference point state can be output as a voltage. Thus, the detection accuracy is improved.

According to the magnetic field sensor of the configuration (3), it is possible to separately use either or both of the phase difference detection circuit and the amplitude detection circuit if necessary by using the selection circuit. Accordingly, it is possible to widen the magnetic field detection range or improve the detection accuracy.

According to the magnetic field sensor of the configuration (4), since the selection circuit is used, it is possible to separately and automatically use either or both of the phase difference detection circuit and the amplitude detection circuit in response to the strength of the external magnetic field. Thus, it is possible to obtain an optimal detection result depending on a situation without a particular selection operation of a user.

According to the magnetic field sensor of the configuration (5), since a result obtained by averaging the first magnetic field strength calculated on the basis of the phase difference and the second magnetic field strength calculated on the basis of the amplitude is output, a detection error can be reduced.

According to the magnetic field sensor of the invention, the consuming current can be suppressed, the detection accuracy can be improved, and the magnetic field detection range can be widened. That is, it is possible to detect the magnitude of the external magnetic field by detecting the amplitude at the timing of each vertex in which the voltage change direction of the electric signal changes due to the influence of the external magnetic field applied to the magnetic detection element by the amplitude detection circuit. Further, since a change in amplitude can be detected even when the external magnetic field increases, the magnetic field detection range can be widened. Since the impedance change amount from the reference point is detected, there is no need to allow the flow of the large bias current for the movement of the operation point and it is possible to suppress an increase in consuming current. By using a plurality of kinds of circuits, the detection accuracy is improved.

The invention has been briefly described above. Furthermore, the details of the invention will be further clarified by reading a mode for carrying out the invention (hereinafter referred to as an "embodiment") described below with reference to the attached drawings.

DETAILED DESCRIPTION OF EMBODIMENTS

Detailed embodiments of the invention will be described below with reference to the drawings.

<Configuration Example of Magnetic Field Sensor 200>

Figure 1:
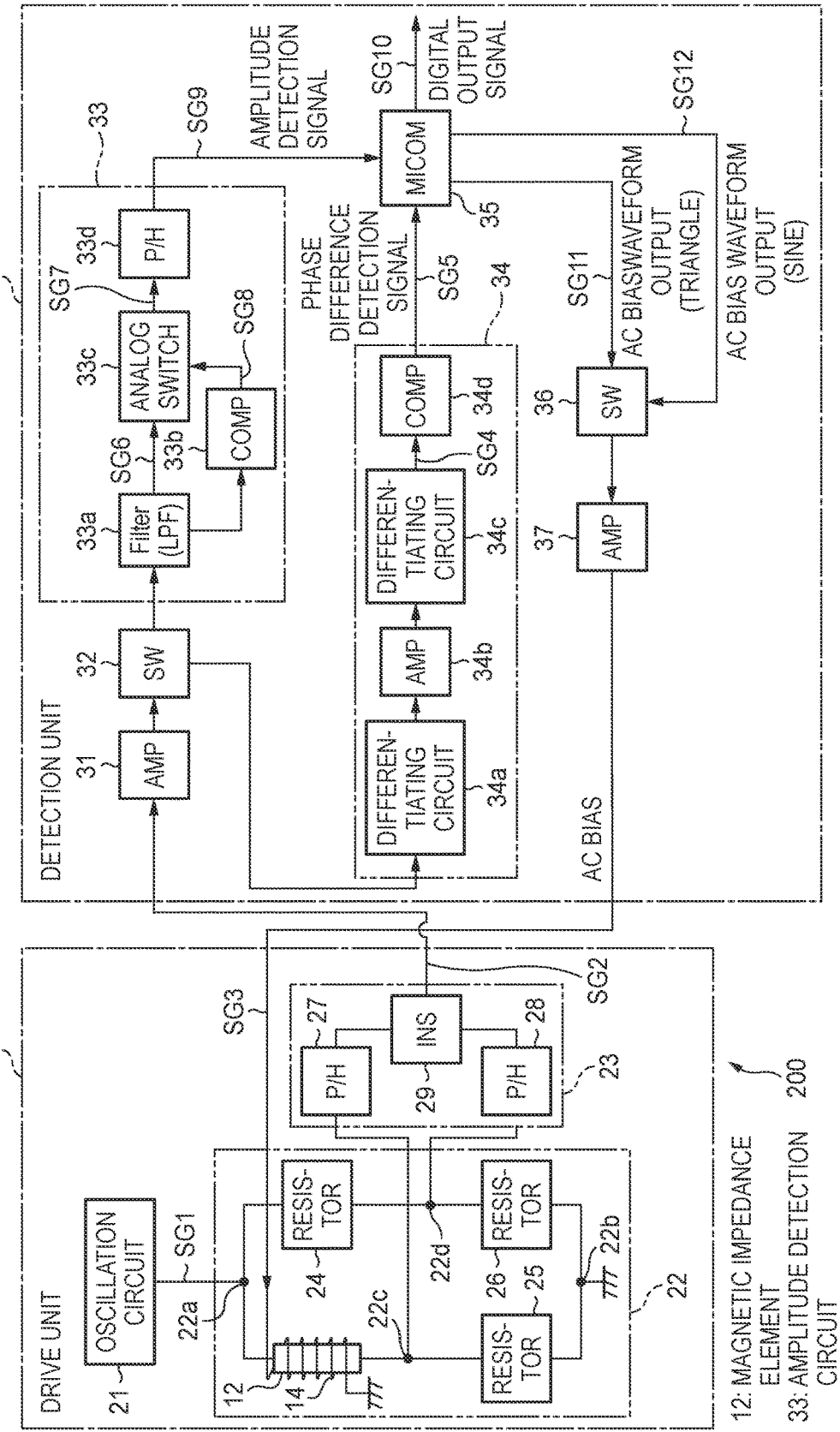
FIG. 1 is a block diagram illustrating a configuration example of a magnetic field sensor according to an embodiment of the invention.

FIG. 1 illustrates a configuration example of a magnetic field sensor 200 of an embodiment of the invention.

The magnetic field sensor 200 illustrated in FIG. 1 includes a drive unit 20 and a detection unit 30. Although the details will be described below, a magnetic impedance element 12 included in the drive unit 20 includes a magnetic material that causes a magnetic impedance effect. That is, the magnetic field sensor 200 detects an external magnetic field by using the magnetic impedance element 12.

The drive unit 20 illustrated in FIG. 1 includes an oscillation circuit 21, a bridge circuit 22, and a signal processing unit 23. The bridge circuit 22 includes the magnetic impedance element 12 and three resistors 24, 25, and 26. One end and the other end of the magnetic impedance element 12 in the longitudinal direction of the magnetic material are connected to the bridge circuit 22.

A bias coil 14 which is disposed in the periphery of the magnetic material of the magnetic impedance element 12 is provided to apply an AC bias magnetic field to the magnetic material. In the embodiment, the bias coil 14 is used to generate a negative feedback magnetic field. An AC bias signal SG3 is applied to one end of the bias coil 14. The other end of the bias coil 14 is connected to an earth. A waveform of the AC bias signal SG3 is basically a waveform which is selected by switching of the switch circuit 36.

The magnetic impedance element 12 which serves as one resistor is connected to the bridge circuit 22. The magnetic impedance element 12 which is employed in the embodiment has a characteristic in which impedance (a DC resistance) becomes maximal in a reference state where no external magnetic field is applied. Then, the resistance values of the resistor 24, 25, and 26 are set so that the bridge circuit 22 becomes an equilibrium state while the impedance of the magnetic impedance element 12 becomes maximal.

Input terminals 22a and 22b of the bridge circuit 22 are respectively connected to an output of the oscillation circuit 21 and an earth. The oscillation circuit 21 supplies, for example, a high-frequency voltage of approximately several tens [MHz] as a signal SG1 to the bridge circuit 22. The waveform of the signal SG1 is any one of a rectangular wave, a sine wave, and a triangular wave.

Output terminals 22c and 22d of the bridge circuit 22 are respectively connected to input terminals of the signal processing unit 23. The signal processing unit 23 includes two peak hold circuits (P/H) 27 and 28 and an instrumentation amplifier (INS) 29.

The peak hold circuit 27 detects the peak potential in the potential of the terminal 22c of the bridge circuit 22 and holds the peak potential. The peak hold circuit 28 detects the peak potential of the potential in the terminal 22d of the bridge circuit 22 and holds the peak potential. The instrumentation amplifier 29 amplifies a potential difference between the peak potential held by the peak hold circuit 27 and the peak potential held by the peak hold circuit 28 and outputs the potential difference as a signal SG2.

Meanwhile, the detection unit 30 includes an amplifier (AMP) 31, a switch circuit (SW) 32, an amplitude detection circuit 33, a phase detection circuit 34, a microcomputer (MICOM) 35, a switch circuit 36, and an amplifier 37.

The amplitude detection circuit 33 includes a low-pass filter (LPF) 33a, a comparator (COMP) 33b, an analog switch 33c, and a peak hold circuit 33d. The phase detection circuit 34 includes a differentiating circuit 34a, an amplifier 34b, a differentiating circuit 34c, and a comparator (COMP) 34d.

The microcomputer 35 performs various controls for realizing a function of the magnetic field sensor 200 by executing an incorporated program. For example, a magnitude and a direction of an external magnetic field detected on the basis of an amplitude detection signal SG9 output from the amplitude detection circuit 33 and a phase difference detection signal SG5 output from the phase detection circuit 34 are checked and the information is output as a digital output signal SG10. A triangular AC bias waveform output signal SG11 and a sine AC bias waveform output signal SG12 are output from the microcomputer 35.

The AC bias waveform output signals SG11 and SG12 are applied to the drive unit 20 via the switch circuit 36 and the amplifier 37 and are supplied as the AC bias signal SG3 to the bias coil 14.

<Configuration Example of Magnetic Impedance Element 12>

Figure 2A:
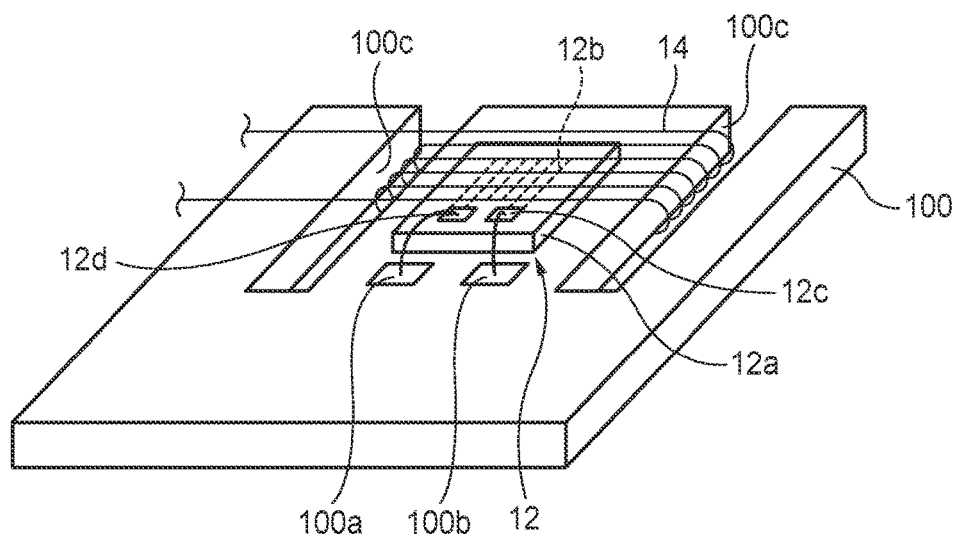
FIGS. 2A and 2B are perspective views respectively illustrating configuration examples of two kinds of magnetic impedance elements.
Figure 2B:
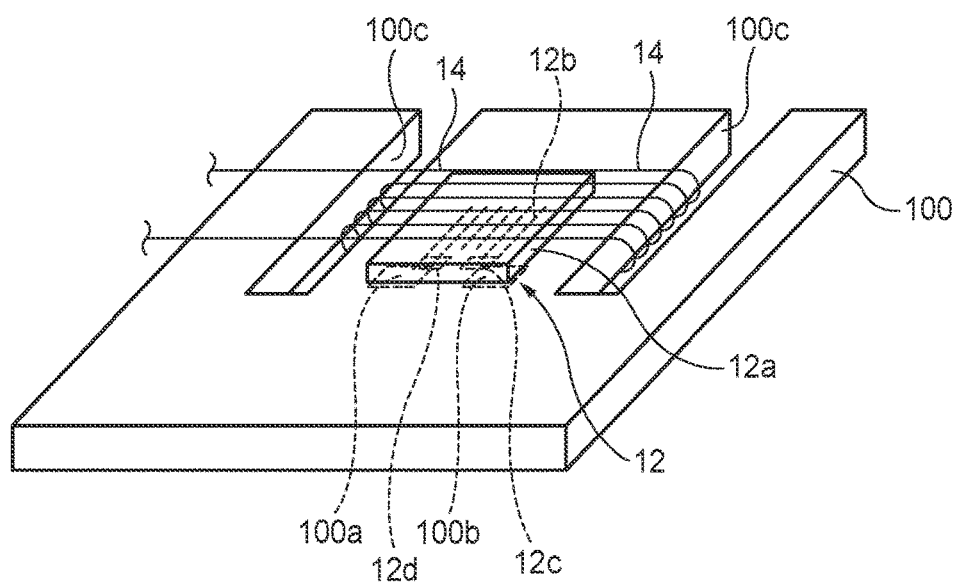

Configuration examples of two kinds of magnetic impedance elements 12 are respectively illustrated in FIGS. 2A and 2B. As illustrated in FIG. 2A, the magnetic impedance element 12 includes a nonmagnetic substrate 12a, a magnetic thin film (a magnetic film) 12b, and electrodes 12c and 12d.

The nonmagnetic substrate 12a is a substrate which is formed of a nonmagnetic material and is placed on a printed board 100. The nonmagnetic substrate 12a is formed of calcium titanate, oxide glass, titania, alumina, and the like, and in this embodiment, is formed in a substantially rectangular parallelepiped shape.

The magnetic thin film 12b is formed as a high magnetic permeability metal magnetic film and is formed in a meander shape (a spiral folded shaped) in a plan view in a surface opposite to a surface provided with the printed board 100 in a surface of the nonmagnetic substrate 12a as illustrated in FIG. 2A. More specifically, the up and down direction of the rectangular waveform shape of the magnetic thin film 12b substantially extends in the longitudinal direction of the nonmagnetic substrate 12a formed in a substantially parallelepiped shape.

The magnetic thin film 12b has magnetic anisotropy in which an easy magnetization axis direction is the same as the longitudinal direction of the magnetic thin film 12b in a film surface and thus the longitudinal direction of the nonmagnetic substrate 12a is the same as the easy magnetization axis direction as a whole.

The electrodes 12c and 12d are provided on the surface of the nonmagnetic substrate 12a to be positioned at both ends of the magnetic thin film 12b and are connected to the electrodes 100a and 100b on the printed board 100 by a bonding wire. Thus, the electrodes 100a and 100b on the printed board 100 are respectively connected to the terminals 22a and 22c of the bridge circuit 22 illustrated in FIG. 1.

As illustrated in FIG. 2A, the printed board 100 includes notch portions 100c on both sides in the width direction of the magnetic impedance element 12 to be separated from the magnetic impedance element 12. The notch portion 100c extends from one end of the printed board 100 to the vicinity of the center of the printed board 100.

The bias coil 14 is wound on the magnetic impedance element 12 through the notch portion 100c of the printed board 100. For this reason, the coil axis direction of the bias coil 14 is the same as the longitudinal direction of the nonmagnetic substrate 12a and the longitudinal direction of the magnetic impedance element 12 becomes a magnetic field detection direction. Further, since the longitudinal direction of the nonmagnetic substrate 12a is set to be the same as the easy magnetization axis direction as described above, the magnetic anisotropy is set so that the easy magnetization axis of the magnetic thin film 12b becomes the same as the magnetic field detection direction.

As illustrated in FIG. 2B, the magnetic thin film 12b may be formed on a back surface of the nonmagnetic substrate 12a, that is, a surface provided with the printed board 100.

In this case, the electrodes 12c and 12d are provided on the back surface of the nonmagnetic substrate 12a to be positioned at both ends of the magnetic thin film 12b. The electrodes 100a and 100b on the printed board 100 are also formed on the back surface of the nonmagnetic substrate 12a. As the configuration of the magnetic impedance element 12 of the magnetic field sensor 200 illustrated in FIG. 1, any configuration illustrated in FIGS. 2A and 2B may be employed.

<Magnetic Detection Characteristic of Magnetic Impedance Element 12>

Figure 3:
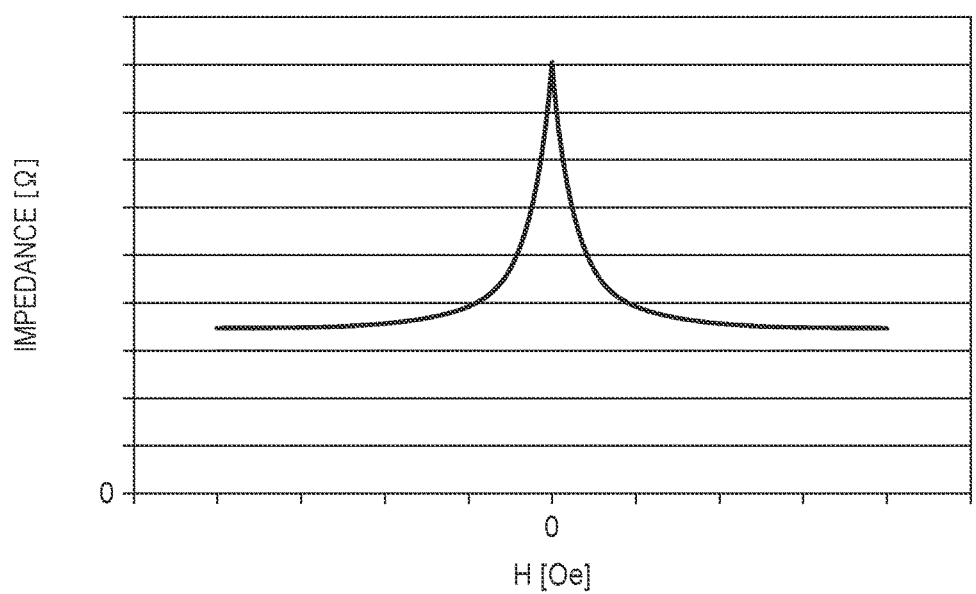
FIG. 3 is a graph illustrating a specific example of a magnetic detection characteristic of the magnetic impedance element.

A specific example of the magnetic detection characteristic of the magnetic impedance element 12 is illustrated in FIG. 3. In FIG. 3, a horizontal axis indicates the magnitude and the direction H [Oe] of the external magnetic field and a vertical axis indicates an impedance (a DC resistance) [Ω] between both ends of the magnetic thin film 12b in the longitudinal direction.

That is, the impedance of the magnetic impedance element 12 is formed in a pyramid shape as illustrated in FIG. 3 in that the impedance of the magnetic impedance element becomes maximal when the magnitude of the external magnetic field becomes zero and the impedance decreases in proportional to the magnitude of the external magnetic field at the time of the application of the external magnetic field in the normal or reverse direction. Thus, the characteristic of the magnetic impedance element 12 is largely different from a general magnetic impedance element having an M-shape illustrated in JP-A-H09-127218 and JP-A-2000-180521.

By employing the magnetic impedance element 12 having such a pyramid-shaped characteristic, the impedance change inclination with respect to a change in external magnetic field sufficiently increases as illustrated in FIG. 3 even in the vicinity of a reference point at which the impedance reaches an extreme value (in this case, a peak value). For that reason, it is possible to highly sensitively detect the external magnetic field without shifting an operation point to a position deviated from the reference point and there is no need to flow a large bias current.

<Basic Operation Principle in Case of Using Magnetic Impedance Element 12>

Figure 4:
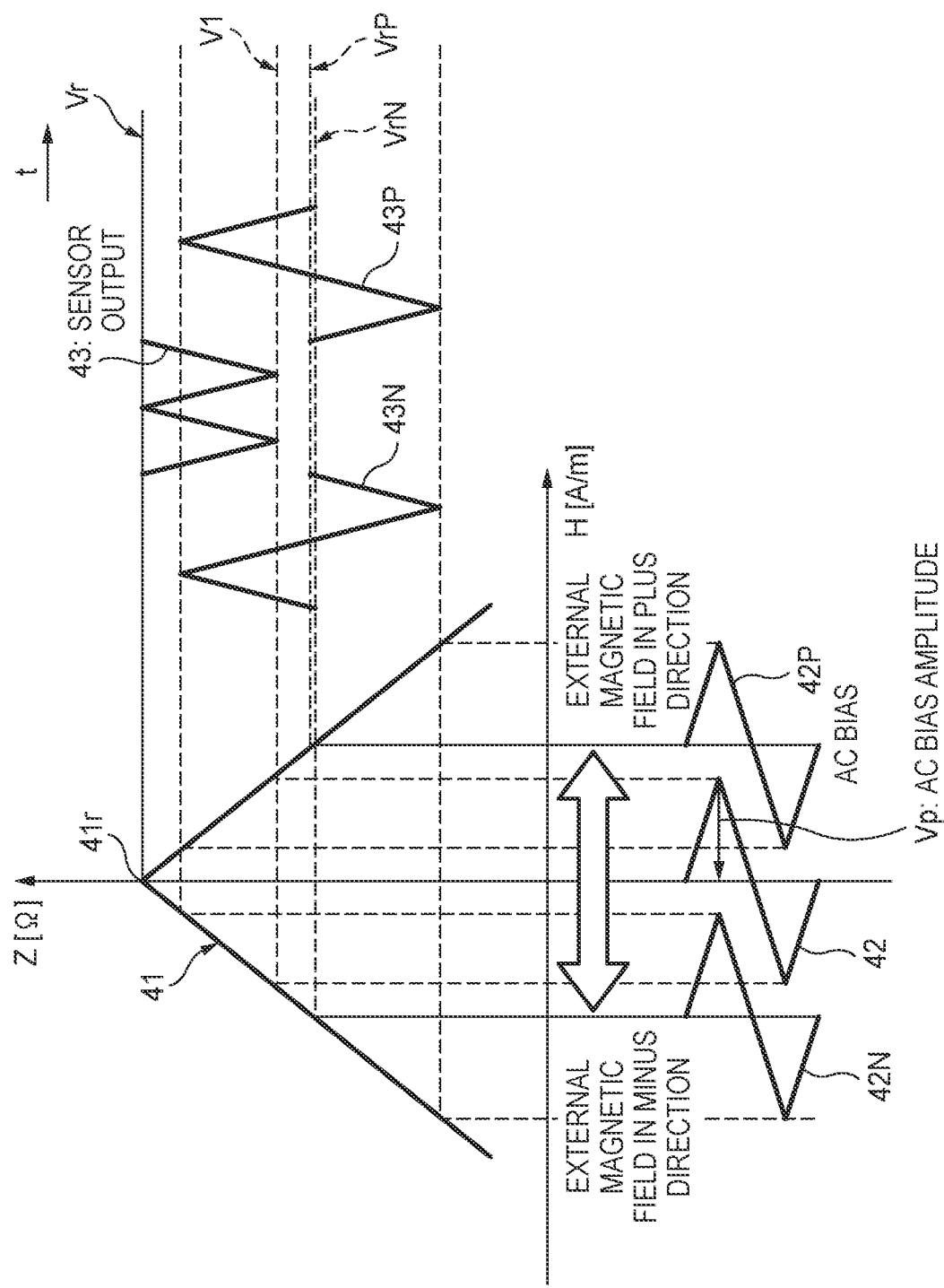
FIG. 4 is a graph illustrating an example of a correlation between an input magnetic field and an output signal in the magnetic impedance element.

An example of a correlation between the input magnetic field and the output signal in the magnetic impedance element 12 is illustrated in FIG. 4. In a graph of an impedance characteristic 41 of FIG. 4, a horizontal axis of a graph of an impedance characteristic 41 indicates the magnitude and the direction of the input magnetic field H [A/m] applied to the magnetic impedance element 12 and a vertical axis indicates an impedance Z (a DC resistance value) [Ω] between both ends of the magnetic thin film 12b of the magnetic impedance element 12 in the longitudinal direction.

As illustrated in FIG. 4, an AC bias magnetic field 42 is applied to the magnetic thin film 12b by a current flowing to the bias coil 14 so as to operate around a reference point 41r of the impedance characteristic 41. In the example of FIG. 4, a case is assumed in which the AC bias magnetic field 42 having a triangular waveform is applied at the magnitude of the amplitude Vp. Thus, the direction of the AC bias magnetic field 42 alternately changes at the amplitude of Vp in the plus direction and the minus direction around the reference point 41r.

Then, an external magnetic field which is a detection target is applied to the magnetic thin film 12b in addition to the AC bias magnetic field 42. Thus, as illustrated in FIG. 4, sums 42P and 42N of the external magnetic field and the AC bias magnetic field are applied to the magnetic thin film 12b.

That is, in a case where the external magnetic field is in the plus direction, a waveform obtained by shifting the waveform of the AC bias magnetic field 42 in the plus direction by the magnitude of the external magnetic field is applied as the sum 42P of the external magnetic field and the AC bias magnetic field to the magnetic thin film 12b. In a case where the external magnetic field is in the minus direction, a waveform obtained by shifting the waveform of the AC bias magnetic field 42 in the minus direction by the magnitude of the external magnetic field is applied as the sum 42N of the external magnetic field and the AC bias magnetic field to the magnetic thin film 12b.

Then, the impedance Z changes in accordance with the magnetic field applied to the magnetic thin film 12b, that is, the AC bias magnetic field 42 and the sums 42P and 42N of the external magnetic field and the AC bias magnetic field, and the impedance characteristic 41. This change in impedance Z can be taken out as sensor output signals 43, 43P, and 43N by using, for example, the bridge circuit 22 illustrated in FIG. 1.

In FIG. 4, the sensor output signals 43, 43P, and 43N respectively correspond to the AC bias magnetic field 42 and the sums 42P and 42N of the external magnetic field and the AC bias magnetic field. That is, the states of the sensor output signals 43, 43P, and 43N are determined in response to a change in AC bias magnetic field 42 and the external magnetic field. Regarding the sensor output signals 43, 43P, and 43N illustrated in FIG. 4, a vertical direction indicates the potential and the amplitude of the signal and a horizontal direction indicates a change in time t.

When the external magnetic field is zero, the sensor output signal 43 is output. That is, it is possible to obtain the sensor output signal 43 which changes in accordance with a change in the AC bias magnetic field 42 between a potential Vr corresponding to a resistance value of the reference point 41r and a potential V1 deviated from the reference point by a potential difference corresponding to the amplitude Vp.

In the case of the application of the external magnetic field in the plus direction, it is possible to obtain the sensor output signal 43P which changes in accordance with a change in the AC bias magnetic field 42 between potentials deviated up and down by a potential difference corresponding to the amplitude Vp around a potential VrP shifted from the potential Vr of the reference point 41r by the magnitude of the external magnetic field. In the case of the application of the external magnetic field in the minus direction, it is possible to obtain the sensor output signal 43N which changes in accordance with a change in the AC bias magnetic field 42 between potentials deviated up and down by a potential difference corresponding to the amplitude Vp around a potential VrN shifted from the potential Vr of the reference point 41r by the magnitude of the external magnetic field.

As illustrated in FIG. 4, a change in response to a difference in magnitude and direction of the external magnetic field occurs in the sensor output signals 43, 43P, and 43N. Thus, it is possible to specify the magnitude and the direction of the external magnetic field on the basis of the sensor output signals 43P and 43N.

<Change Example of Main Signal Inside Magnetic Field Sensor 200>

Figure 5:
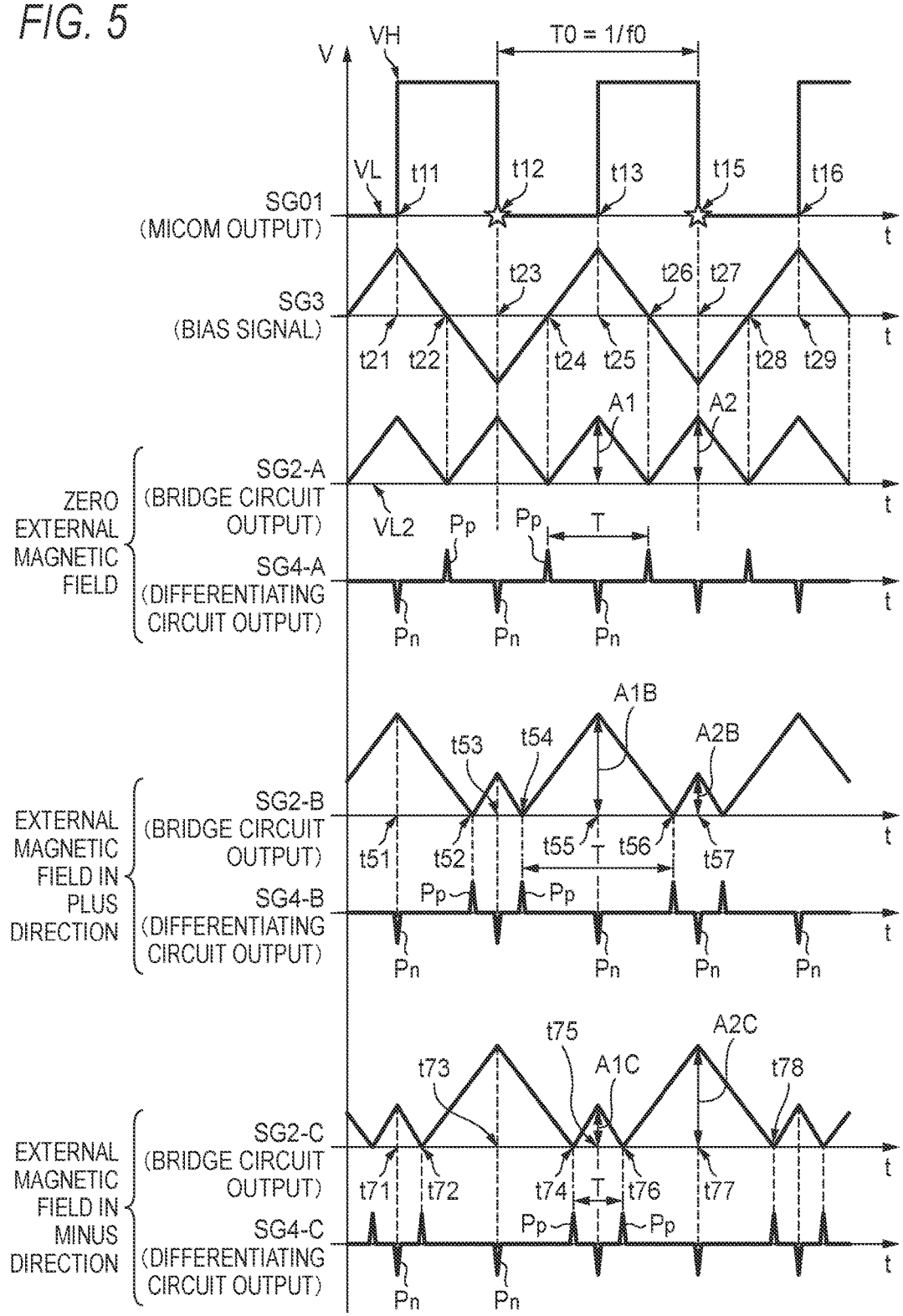
FIG. 5 is a time chart illustrating change examples of main signals of a magnetic field sensor.

A change example of a main signal inside the magnetic field sensor 200 is illustrated in FIG. 5. In FIG. 5, a horizontal axis of each signal indicates a common time t and a vertical axis indicates a potential.

As illustrated in FIG. 5, when the waveform of the bias signal SG3 applied to the bias coil 14 is set to a triangular waveform, the bias signal SG3 is generated on the basis of the waveform of the AC bias waveform signal SG11 output from the microcomputer 35.

For example, when the potential of the signal SG01 rises from a low potential VL to a high potential VH at the time t11, the potential of the bias signal SG3 starts to fall at a constant inclination and this state is continued until the signal SG01 falls from the high potential VH to the low potential VL at the time t12. The potential of the bias signal SG3 starts to rise at a constant inclination at the time t12 and this state is continued until the signal SG01 rises from the low potential VL to the high potential VH at the time t13. By the repeated operations, the triangular waveform is generated.

The signals SG2-A, SG2-B, and SG2-C illustrated in FIG. 5 respectively correspond to the output of the bridge circuit 22, for example, the waveform of the signal SG2 output from the signal processing unit 23 in FIG. 1. Signals SG4-A, SG4-B, and SG4-C respectively correspond to the output of the differentiating circuit, for example, the signal SG4 output from the differentiating circuit 34c illustrated in FIG. 1. The signals SG2-A and SG4-A illustrate a state where the external magnetic field is zero, the signals SG2-B and SG4-B illustrate an example of a case where the external magnetic field is in the plus direction, and the signals SG2-C and SG4-C illustrate an example of a case where the external magnetic field is in the minus direction.

The waveform of the signal SG2-A illustrated in FIG. 5 changes as in the waveform of the sensor output signal 43 illustrated in FIG. 4. That is, the waveform of the signal SG2-A becomes to be a low potential VL2 corresponding to the reference point 41r at the times t22, t24, and the like at which the potential of the bias signal SG3 becomes zero and the potential changes to be higher than VL2 in accordance with a change in potential of the bias signal SG3 at the other times. Thus, the waveform of the signal SG2-A becomes a triangular waveform, but the period thereof becomes a half of the period of the bias signal SG3.

<Case of Zero External Magnetic Field>

In the signal SG2-A, amplitudes A1 and A2 are the same. Here, the amplitude A1 indicates the amplitude at the times t21, t25, t29, and the like at each vertex in which the potential of the bias signal SG3 changes from a rising state to a falling state and the amplitude A2 indicates the amplitude at the times t23, t27, and the like at each vertex in which the potential of the bias signal SG3 changes from a falling state to a rising state.

Meanwhile, in the waveform of the signal SG4-A illustrated in FIG. 5, a pulse Pn having a short time width in the minus potential direction occurs at the times t21, t23, t25, and the like at each vertex in which the potential of the signal SG2-A changes from a rising state to a falling state. In the waveform of the signal SG4-A, a pulse Pp having a short time width in the plus potential direction occurs at the times t22, t24, t26, and the like at vertex in which the potential of the signal SG2-A changes from a falling state to a rising state.

In the waveform of the signal SG4-A, for example, a time period T between two adjacent pulses Pp in the plus potential direction is constant to be a length of a half of one period T0 of the signal SG01. The same applies to the pulse Pn in the minus potential direction. When the frequency of the signal SG01 is f0, the period T0 is expressed by the reciprocal, that is, (1/f0).

<Case of Application of External Magnetic Field in Plus Direction>

Meanwhile, amplitudes A1B and A2B in the signal SG2-B are different from each other. Here, the amplitude A1B indicates an amplitude at the time t55 of a vertex in which the potential of the bias signal SG3 changes from a rising state to a falling state for one period T0 of the signal SG01 and the amplitude A2B indicates an amplitude at the time t57 of a vertex in which the potential of the bias signal SG3 changes from a falling state to a rising state.

That is, since the signal SG2-B is influenced by the external magnetic field in the plus direction applied to the magnetic thin film 12b, the amplitude A1B becomes larger than the amplitude A1 when the external magnetic field is zero and the amplitude A2B becomes smaller than the amplitude A2 when the external magnetic field is zero. That is, since a change in the amplitudes A1B and A2B reflects the magnitude and the direction of the external magnetic field, it is possible to calculate the magnitude and the direction of the external magnetic field by using at least one of the amplitudes A1B and A2B.

Meanwhile, in the waveform of the signal SG4-B illustrated in FIG. 5, the pulse Pn having a short time width in the minus potential direction occurs at the times t51, t53, t55, and the like of each vertex in which the potential of the signal SG2-B changes from a rising state to a falling state. In the waveform of the signal SG4-B, the pulse Pp having a short time width in the plus potential direction occurs at the times t52, t54, t56, and the like of each vertex in which the potential of the signal SG2-B changes from a falling state to a rising state.

The timing of the pulse Pp in the plus potential direction of the waveform of the signal SG4-B is deviated from that of the signal SG4-A. That is, the influence of the external magnetic field is reflected in the phases (a change in timing) of the pulses Pp and Pn. For example, the time period T between the pulses Pp from the pulse Pp at the time t54 in which the potential of the signal SG4-B starts to rise to the next pulse Pp at the time t56 in which the potential of the signal SG4-B starts to rise is larger than that of the signal SG4-A.

That is, the time period T between the pulses Pp in the plus potential direction reflects the phase difference of the pulses Pp generated by the influence of the external magnetic field. Thus, it is possible to calculate the magnitude and the direction of the external magnetic field by detecting the phase difference of the pulses Pp or the time period T.

<Case of Application of External Magnetic Field in Minus Direction>

Meanwhile, amplitudes A1C and A2C in the signal SG2-C are different from each other. Here, the amplitude A1C indicates an amplitude at the time t75 of a vertex in which the potential of the bias signal SG3 changes from a rising state to a falling state during one period T0 of the signal SG01 and the amplitude A2B indicates an amplitude at the time t77 of a vertex in which the potential of the bias signal SG3 changes from a falling state to a rising state.

That is, since the signal SG2-C is influenced by the external magnetic field in the minus direction applied to the magnetic thin film 12b, the amplitude A1C becomes smaller than the amplitude A1 when the external magnetic field is zero and the amplitude A2C becomes larger than the amplitude A2 when the external magnetic field is zero. That is, since a change of the amplitudes A1C and A2C reflects the magnitude and the direction of the external magnetic field, it is possible to calculate the magnitude and the direction of the external magnetic field by using at least one of the amplitudes A1C and A2C.

Meanwhile, in the waveform of the signal SG4-C illustrated in FIG. 5, the pulse Pn having a short time width in the minus potential direction occurs at the times t71, t73, t75, and the like of each vertex in which the potential of the signal SG2-C changes from a rising state to a falling state. In the waveform of the signal SG4-C, the pulse Pp having a short time width in the plus potential direction occurs at the times t72, t74, t76, and the like of each vertex in which the potential of the signal SG2-C changes from a falling state to a rising state.

The timing of the pulse Pp in the plus potential direction of the waveform of the signal SG4-C is deviated from that of the signal SG4-A. That is, the influence of the external magnetic field is reflected in the phase (a change in timing) of the pulse Pp and Pn. For example, the time period T between the pulses Pp from the pulse Pp at the time t74 in which the potential of the signal SG4-C starts to rise to the next pulse Pp at the time t76 in which the potential of the signal SG4-C starts to rise is smaller than that of the signal SG4-A.

That is, the time period T between the pulses Pp in the plus potential direction reflects the phase difference of the pulses Pp generated by the influence of the external magnetic field. Thus, it is possible to calculate the magnitude and the direction of the external magnetic field by detecting the phase difference of the pulses Pp or the time period T.

<Change Examples of Main Signals in Case of Large External Magnetic Field>

Figure 6:
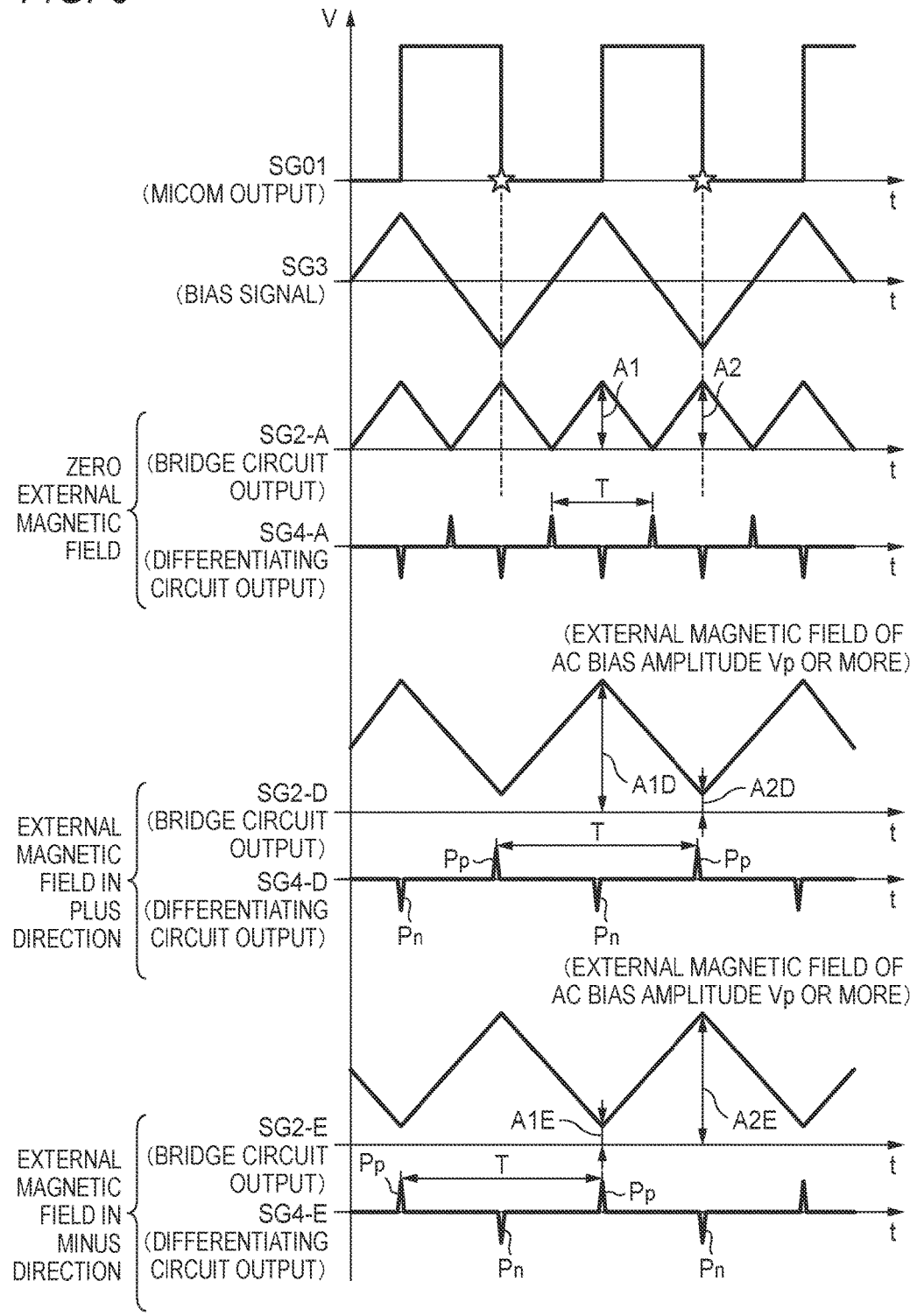
FIG. 6 is a time chart illustrating change examples of main signals when an external magnetic field is large.

A change example of the main signal when the external magnetic field is large is illustrated in FIG. 6. In FIG. 6, a horizontal axis of each signal indicates a common time t and a vertical axis indicates a potential. The signals SG01, SG3, SG2-A, and SG4-A in FIG. 6 are the same as those of FIG. 5.

The signals SG2-A, SG2-D, and SG2-E illustrated in FIG. 5 respectively correspond to the output of the bridge circuit 22, for example, the waveform of the signal SG2 output from the signal processing unit 23 in FIG. 1. The signals SG4-A, SG4-D, and SG4-E respectively correspond to the output of the differentiating circuit, for example, the signal SG4 output from the differentiating circuit 34c in FIG. 1.

The signal SG2-A and SG4-A illustrate a state where the external magnetic field is zero. The signals SG2-D and SG4-D illustrate an example of a case where the external magnetic field is in the plus direction and the magnitude of the external magnetic field is larger than the amplitude Vp of the AC bias. The signals SG2-E and SG4-E illustrate an example of a case where the external magnetic field is in the minus direction and the magnitude of the external magnetic field is larger than the amplitude Vp of the AC bias.

In the example illustrated in FIG. 6, the waveforms of the signals SG2-D and SG2-E are substantially the same as that of the bias signal SG3 due to an influence in which the external magnetic field is larger than the amplitude Vp. For that reason, the phase of each pulse Pp in the plus direction occurring in the signal SG4-D becomes constant and the time period T between two adjacent pulses Pp becomes also constant. Similarly, also in the signal SG4-E, the phase of each pulse Pp in the plus direction becomes constant and the time period T between two adjacent pulses Pp becomes also constant.

Thus, in the state illustrated in FIG. 6, it is not possible to detect the external magnetic field from the phase or the period of the pulse in the signals SG4-D and SG4-E. That is, it is possible to detect a change in phase of the pulse Pp as in the signals SG4-B and SG4-C illustrated in FIG. 5 only when the magnitude of the external magnetic field is smaller than the amplitude Vp of the AC bias.

However, also in the state illustrated in FIG. 6, since the amplitudes A1D and A2D of the signal SG2-D are affected by the magnitude of the external magnetic field, it is possible to calculate the magnitude or the direction of the external magnetic field on the basis of information of at least one of the amplitudes A1D and A2D. Similarly, since the amplitudes A1E and A2E of the signal SG2-E are affected by the magnitude of the external magnetic field, it is possible to calculate the magnitude or the direction of the external magnetic field on the basis of information of at least one of the amplitudes A1E and A2E.

<Operation of Detection Unit 30>

The signal SG2 which is output from the instrumentation amplifier 29 of the drive unit 20 is applied to the input of the amplifier 31 inside the detection unit 30. The signal SG2 has a triangular waveform similarly to the signal SG2-A illustrated in FIG. 5 when the external magnetic field is zero. The waveforms of the signals SG2-B and SG2-C illustrated in FIG. 5 are formed, respectively when the external magnetic field is in the plus direction and is in the minus direction. When the magnitude of the external magnetic field becomes equal to or larger than the amplitude Vp of the bias signal, the waveforms of the signals SG2-D and SG2-E illustrated in FIG. 6 are formed. The signal SG2 is amplified by the amplifier 31 and is selectively applied to any input of the amplitude detection circuit 33 and the phase detection circuit 34 by the switching of the switch circuit 32.

<Operation of Amplitude Detection Circuit 33>

In the amplitude detection circuit 33, a signal having a waveform which is the same as those of the signals SG2-A, SG2-B, and SG2-C of FIG. 5 is applied to the input of the low-pass filter (LPF) 33a. The low-pass filter 33a removes a high-frequency element by performing a signal integration operation. Thus, for example, when a signal having a triangular waveform is input, the signal SG6 having a substantially sine waveform is output from the low-pass filter 33a.

The comparator (COMP) 33b compares the potential of the output signal of the low-pass filter 33a with a threshold value and generates a binary signal SG8 for controlling the on/off state of the analog switch 33c. The signal SG6 which is output from the low-pass filter 33a is input to the peak hold circuit 33d through the analog switch 33c.

The peak hold circuit 33d can detect the peak potential of the signal SG7 output from the analog switch 33c and hold the peak potential. Thus, for example, voltages respectively corresponding to the amplitudes A1B, A2B, A1C, and A2C of the signals SG2-B and SG2-C illustrated in FIG. 5 can be output as the amplitude detection signals SG9.

<Operation of Phase Detection Circuit 34>

In the phase detection circuit 34, a signal having a waveform which is the same as those of the signals SG2-A, SG2-B, and SG2-C of FIG. 5 is input from the output of the switch circuit 32 to the differentiating circuit 34a. The phase detection circuit 34 differentiates the input signal by the differentiating circuit 34a, amplifies the signal by the amplifier 34b, and differentiates the signal again by the next differentiating circuit 34c to generate the signal SG4.

Thus, as in the signals SG4-B and SG4-C illustrated in FIG. 5, the pulse Pn in the minus direction occurs at the timing of each vertex in which the potentials of the signals SG2-B and SG2-C change from a rising state to a falling state. The pulse Pp in the plus direction occurs at the timing of each vertex in which the potentials of the signals SG2-B and SG2-C change from a falling state to a rising state.

The comparator (COMP) 34d outputs a result obtained by comparing the potential of the signal SG4 output from the differentiating circuit 34c with a threshold value as a binary signal. The binary signal is the phase difference detection signal SG5 which accurately illustrates the timing of each pulse Pp in the plus direction.

<Basic Operation of Microcomputer 35>

The microcomputer 35 can measure the voltage of the amplitude detection signal SG9 output from the amplitude detection circuit 33 to check, for example, either or both of the amplitudes A1B and A2B illustrated in FIG. 5 and calculate the magnitude and the direction of the external magnetic field on the basis of the result. The microcomputer 35 can measure, for example, the length of each time period T illustrated in FIG. 5 on the basis of the timing of the phase difference detection signal SG5 output from the phase detection circuit 34 and calculate the magnitude and the direction of the external magnetic field on the basis of the result.

<Relation Between External Magnetic Field and Operation of Phase Detection Circuit 34>

Figure 7:
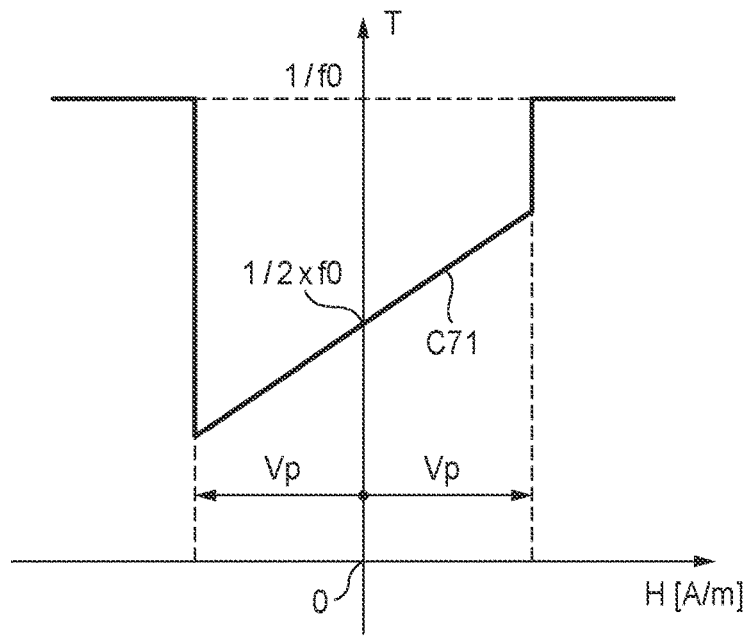
FIG. 7 is a graph illustrating an example of a relation between an external magnetic field and an operation of a phase detection circuit.

An example of a relation between the external magnetic field and the operation of the phase detection circuit 34 is illustrated in FIG. 7. A characteristic C71 illustrated in FIG. 7 illustrates an example of the detection characteristic of the phase detection circuit 34 inside the detection unit 30. In FIG. 7, a horizontal axis indicates the magnitude and the direction of the external magnetic field H [A/m] and a vertical axis indicates the length of the time period T (see FIGS. 5 and 6) of the pulse Pp in the plus direction of the signals SG4 and SG5 of the phase detection circuit 34.

As illustrated in FIG. 7, in the characteristic C71, the detected time period T while the external magnetic field H is zero becomes "(1/(2×f0))". The frequency f0 is the basic frequency of the signal SG01. When the external magnetic field H is in the range of "−Vp<H<+Vp", the time period T which is detected in proportional to a change in magnitude of the external magnetic field H linearly increases. "Vp" indicates the amplitude of the AC bias magnetic field. When the external magnetic field H is in the range equal to or smaller than "−Vp" and the external magnetic field H is in the range equal to or larger than "Vp", the detected time period T becomes a constant value, that is, "T=(1/f0)".

That is, when the external magnetic field H is in the range of "−Vp<H<+Vp", the microcomputer 35 can calculate the magnitude and the direction of the external magnetic field H on the basis of the equation corresponding to the characteristic C71 and the time period T of the phase difference detection signal SG5 output from the phase detection circuit 34.

The direction of the external magnetic field H can be determined as the plus direction when the detected time period T is larger than "(1/(2×f0))" and can be determined as the minus direction when the detected time period T is smaller than "(1/(2×f0))" as in the characteristic C71 illustrated in FIG. 7.

However, when the external magnetic field H is in a range equal to or smaller than "−Vp" and the external magnetic field H is in a range equal to or larger than "+Vp", it is not possible to calculate the external magnetic field H from the detected time period T. Here, when the external magnetic field H is in a range equal to or smaller than "−Vp" and the external magnetic field H is in a range equal to or larger than "+Vp", the microcomputer 35 calculates the magnitude and the direction of the external magnetic field H by using the amplitude detection signal SG9 output from the amplitude detection circuit 33.

<Relation Between External Magnetic Field and Amplitude Detected by Phase Detection Circuit 34>

Figure 8:
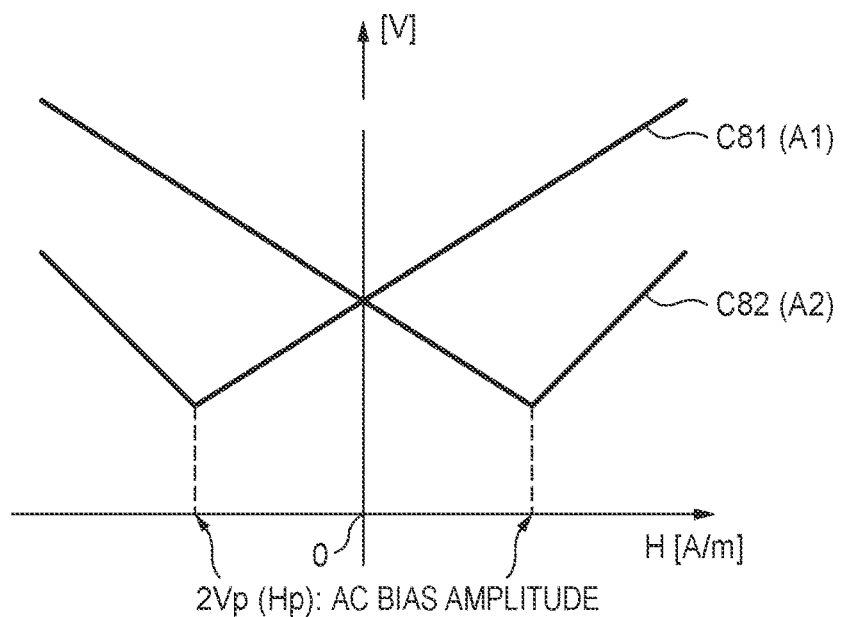
FIG. 8 is a graph illustrating an example of a relation between an external magnetic field and amplitude detected by an amplitude detection circuit.

An example of a relation between the external magnetic field and the amplitude detected by the phase detection circuit 34 is illustrated in FIG. 8. Characteristics C81 and C82 illustrated in FIG. 8 illustrate the detection characteristic of the amplitude detection circuit 33 and the characteristics C81 and C82 respectively correspond to the amplitudes A1 and A2 of FIG. 5 in the amplitude detection signal SG9 output from the amplitude detection circuit 33.

That is, the amplitude A1 indicates the voltage [V] of the amplitude of the signal SG2 at the rising timing of the signal SG01 and the amplitude A2 indicates the voltage of the amplitude of the signal SG2 at the falling timing of the signal SG01. In FIG. 8, a horizontal axis indicates the magnitude and the direction of the external magnetic field H [A/m] and a vertical axis indicates voltages of the amplitudes A1 and A2.

As illustrated in FIG. 8, in the characteristic C81, the voltage of the amplitude A1 becomes minimal when the magnitude of the external magnetic field H at the minus side is "2 Vp" and the voltage of the amplitude A1 increases as the magnitude of the external magnetic field H becomes farther from the reference point.

In the characteristic C82, the voltage of the amplitude A2 becomes minimal when the magnitude of the external magnetic field H at the plus side is "2 Vp" and the voltage of the amplitude A2 increases as the magnitude of the external magnetic field H becomes farther from the reference point.

Thus, it is possible to calculate the magnitude of the external magnetic field H on the basis of, for example, information of at least one of the characteristics C81 and C82 illustrated in FIG. 8 and the voltages of the amplitudes A1 and A2 of the amplitude detection signal SG9 output from the amplitude detection circuit 33. Since the characteristics C81 and C82 are different from each other, it is possible to specify the (plus/minus) direction of the external magnetic field H by comparing, for example, the magnitude relation of the voltages of the amplitudes A1 and A2.

<Relation Between External Magnetic Field and Operation of Amplitude Detection Circuit 33>

Figure 9:
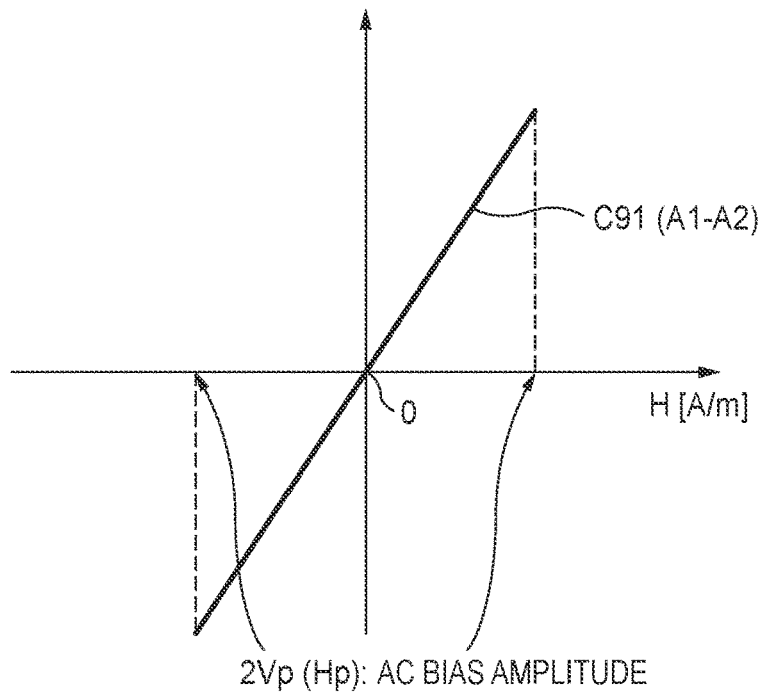
FIG. 9 is a graph illustrating an example of a relation between an external magnetic field and an operation of an amplitude detection circuit.

An example of a relation between the external magnetic field and the operation of the amplitude detection circuit 33 is illustrated in FIG. 9. A characteristic C91 illustrated in FIG. 9 indicates the detection characteristic of the amplitude detection circuit 33 and specifically corresponds to the difference (A1−A2) between the amplitudes A1 and A2 in FIG. 5 of the amplitude detection signal SG9 output from the amplitude detection circuit 33. In FIG. 9, a horizontal axis indicates the magnitude and the direction of the external magnetic field H [A/m] and a vertical axis indicates the voltage [V] of the amplitude difference (A1−A2).

As illustrated in FIG. 9, in the characteristic C91, the voltage of the amplitude difference (A1−A2) becomes zero while the external magnetic field H is zero. In the plus area of the external magnetic field H, the voltage of the amplitude difference (A1−A2) increases in the plus direction in proportional to an increase in magnitude of the external magnetic field H. In the minus area of the external magnetic field H, the voltage of the amplitude difference (A1−A2) increases in the minus direction in proportional to an increase in magnitude of the external magnetic field H.

That is, the microcomputer 35 can calculate the voltage of the amplitude difference (A1−A2) on the basis of the voltage of the amplitude detection signal SG9 output from the amplitude detection circuit 33 and calculate the magnitude of the external magnetic field H on the basis of the amplitude difference (A1−A2) and the characteristic C91 illustrated in FIG. 9. It is possible to specify the (plus/minus) direction of the external magnetic field H by identifying the positive/negative state of the voltage of the amplitude difference (A1−A2).

<Process Sequence of Characteristic Operation>

Figure 10:
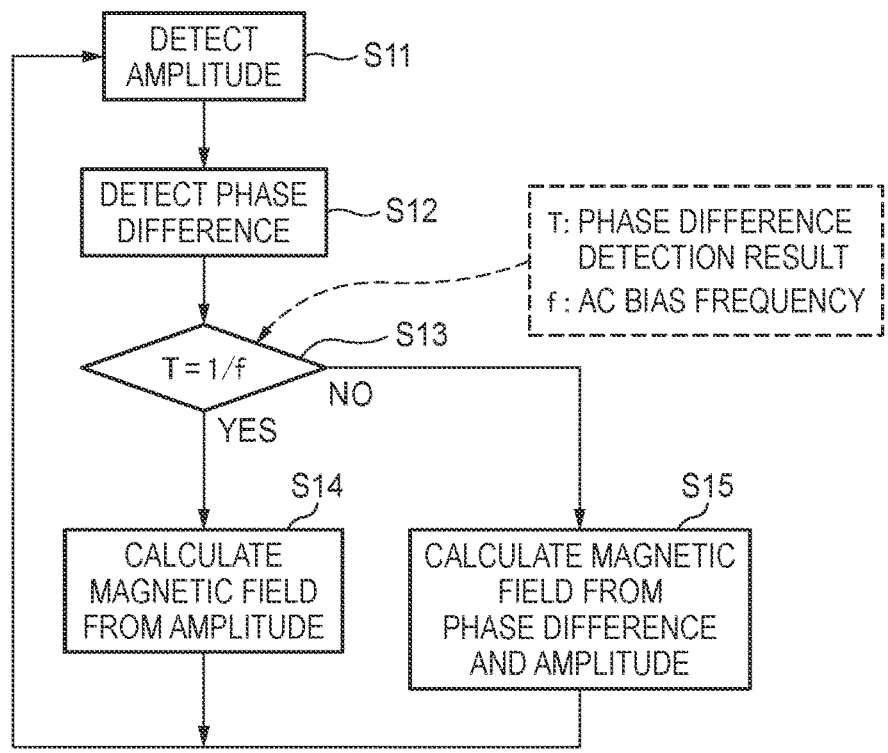
FIG. 10 is a flowchart illustrating a process sequence of a characteristic operation of a magnetic field sensor.

A process sequence of a characteristic operation of the magnetic field sensor 200 is illustrated in FIG. 10. That is, when the microcomputer 35 of the magnetic field sensor 200 performs the process sequence illustrated in FIG. 10, it is possible to automatically and separately use the amplitude detection circuit 33 and the phase detection circuit 34 depending on a situation.

In step S11, the microcomputer 35 acquires information of either or both of the amplitudes A1 and A2 by inputting a signal corresponding to the signal SG2 to the amplitude detection circuit 33 by switching of the switch circuit 32 and measuring the voltage of the amplitude detection signal SG9 output from the amplitude detection circuit 33.

In step S12, the microcomputer 35 inputs a signal corresponding to the signal SG2 to the phase detection circuit 34 by switching of the switch circuit 32 and measures the time period T from the phase difference detection signal SG5 output from the phase detection circuit 34.

In step S13, the microcomputer 35 compares the AC bias period T0(=1/f) with the time period T obtained by the detection of the phase difference of step S12. In the case of "T=T0", the routine proceeds to step S14 and when the time period T is different from the AC bias period T0, the routine proceeds to step S15.

As for a state where the routine proceeds to step S14, the magnitude of the external magnetic field He applied to the magnetic impedance element 12 is equal to or larger than the amplitude Vp of the AC bias signal SG3 and the information of the phase difference changing in response to the external magnetic field as in the signals SG4-D and SG4-E illustrated in FIG. 6 cannot be obtained.

Thus, in step S14, the microcomputer 35 calculates the magnitude and the direction of the external magnetic field He by using only the amplitude detection result (A1 and A2) of step S11.

Meanwhile, as for a state where the routine proceeds to step S15, the magnitude of the external magnetic field He applied to the magnetic impedance element 12 is smaller than the amplitude Vp of the AC bias signal SG3 and the information of the phase difference changing in response to the external magnetic field as in the signals SG4-B and SG4-C illustrated in FIG. 5 can be obtained.

Thus, in step S15, the microcomputer 35 calculates the magnitude and the direction of the external magnetic field He by using both the amplitude detection result (A1 and A2) of step S11 and the phase difference detection result (T) of step S12.

In step S15, any one of the following operations (A), (B), and (C) can be selected by, for example, the selection operation of a user or the automatic operation depending on a situation in order to obtain, for example, a more highly accurate detection result. (A) The magnitude of the external magnetic field He is calculated by using information of both the amplitude and the phase difference. (B) The magnitude of the external magnetic field He is calculated by using only the information of the phase difference. (C) The magnitude of the external magnetic field He is calculated by using only the information of the amplitude.

When the operation (A) is performed, the final magnitude Ht of the external magnetic field may be calculated by, for example, the following expression.

$$Ht=(Ha+Hp)/2$$

Ha: Magnitude of external magnetic field calculated only on the basis of information of amplitude Hp: Magnitude of external magnetic field calculated only on the basis of information of phase difference By performing such averaging, it is possible to obtain a more highly accurate detection result in a wide range of the magnitude of the external magnetic field.

Here, the characteristics of the embodiment of the magnetic field sensor according to the invention will be summarized in the followings [1] to [5].

[1] A magnetic field sensor (200) comprising:

a magnetic detection element (a magnetic impedance element 12) which includes a magnetic material (a magnetic thin film 12b) causing a magnetic impedance effect and a bias coil (14) applying a bias magnetic field to the magnetic material;

a high-frequency oscillation circuit (an oscillation circuit 21) which supplies a high-frequency current to the magnetic material;

an AC bias circuit (an amplifier 37) which supplies an AC bias current to the bias coil; and a detection circuit (a detection unit 30) which sets a reference point corresponding to an extreme impedance position (a peak position of the characteristic of FIG. 3) in a characteristic of the magnetic detection element in the state of no application of an external magnetic field and outputs an electric signal changing in response to an impedance change amount from the reference point, wherein the detection circuit includes an amplitude detection circuit (33) which detects an amplitude (A1, A2) at a timing of each vertex in which at least a voltage change direction of the electric signal changes.

[2] The magnetic field sensor according to [1], wherein the detection circuit includes:

a bridge circuit which includes the magnetic material (the magnetic thin film 12b) of the magnetic detection element and three resistors (24, 25, 26) and becomes an equilibrium state when the magnetic detection element has an impedance at the reference point; and a voltage detection circuit (the signal processing unit 23) which detects an output voltage of the bridge circuit.

[3] The magnetic field sensor according to [1] or [2], wherein the detection circuit includes:

a phase difference detection circuit (the phase detection circuit 34) which detects a phase difference at a timing of each vertex in which a voltage change direction of the electric signal changes; and a selection circuit (the switch circuit 32, the microcomputer 35) which selects either or both of the phase difference detection circuit and the amplitude detection circuit.

[4] The magnetic field sensor according to [3], wherein the selection circuit automatically selects either or both of the phase difference detection circuit and the amplitude detection circuit in response to a magnitude identification result of a strength of the external magnetic field (step S13 to step S15).

[5] The magnetic field sensor according to [4], wherein the detection circuit acquires a first magnetic field strength (Hp) calculated on the basis of a phase difference and a second magnetic field strength (Ha) calculated on the basis of an amplitude by using both outputs of the phase difference detection circuit and the amplitude detection circuit and detects a final magnitude (Ht) of the external magnetic field on the basis of a result obtained by averaging the first magnetic field strength and the second magnetic field strength.

What is claimed is:

1. A magnetic field sensor comprising:
   a magnetic detection element that includes a magnetic material causing a magnetic impedance effect and a bias coil applying a bias magnetic field to the magnetic material;
   a high-frequency oscillation circuit that supplies a high-frequency current to the magnetic material;
   an AC bias circuit that supplies an AC bias current to the bias coil; and
   a detection circuit that sets a reference point corresponding to an extreme impedance position in a characteristic of the magnetic detection element in the state of no application of an external magnetic field and outputs an electric signal changing in response to an impedance change amount from the reference point,
   wherein the detection circuit includes an amplitude detection circuit which detects an amplitude of the electric signal at a timing of each vertex in which at least a voltage change direction of the electric signal changes.

2. The magnetic field sensor according to claim 1, wherein the detection circuit includes:
   a bridge circuit which includes the magnetic material of the magnetic detection element and three resistors and becomes an equilibrium state when the magnetic detection element has an impedance of the reference point; and
   a voltage detection circuit which detects an output voltage of the bridge circuit.

3. The magnetic field sensor according to claim 1, wherein the detection circuit includes:
   a phase difference detection circuit which detects a phase difference at a timing of each vertex in which a voltage change direction of the electric signal changes; and
   a selection circuit which selects either or both of the phase difference detection circuit and the amplitude detection circuit.

4. The magnetic field sensor according to claim 3, wherein the selection circuit automatically selects either or both of the phase difference detection circuit and the amplitude detection circuit in response to a result of identifying a magnitude of a strength of the external magnetic field.

5. The magnetic field sensor according to claim 4, wherein the detection circuit acquires a first magnetic field strength calculated on the basis of the phase difference and a second magnetic field strength calculated on the basis of the amplitude by using both outputs of the phase difference detection circuit and the amplitude detection circuit and detects a final magnitude of the external magnetic field on the basis of a result obtained by averaging the first magnetic field strength and the second magnetic field strength.

* * * * *